United States Patent
Dauksher et al.

(10) Patent No.: US 7,253,528 B2
(45) Date of Patent: Aug. 7, 2007

(54) TRACE DESIGN TO MINIMIZE ELECTROMIGRATION DAMAGE TO SOLDER BUMPS

(75) Inventors: Walter John Dauksher, Ft. Collins, CO (US); Wayne Patrick Richling, Ft. Collins, CO (US); William S. Graupp, Ft. Collins, CO (US)

(73) Assignee: Avago Technologies General IP Pte. Ltd., Singapore (SG)

( * ) Notice: Subject to any disclaimer, the term of this patent is extended or adjusted under 35 U.S.C. 154(b) by 366 days.

(21) Appl. No.: 11/047,887

(22) Filed: Feb. 1, 2005

(65) Prior Publication Data

US 2006/0186539 A1     Aug. 24, 2006

(51) Int. Cl.
*H01L 29/40* (2006.01)
(52) U.S. Cl. .................. 257/775; 257/789; 438/612
(58) Field of Classification Search ........... 438/597, 438/612; 257/773, 774, 775
See application file for complete search history.

(56) References Cited

U.S. PATENT DOCUMENTS 4,654,692 A * 3/1987 Sakurai et al. .............. 257/775
5,289,036 A * 2/1994 Nishimoto ................... 257/774
5,461,260 A * 10/1995 Varker et al. ................ 257/773
6,818,996 B2 * 11/2004 Mertol et al. ............... 257/773

* cited by examiner

*Primary Examiner*—Roy Potter

(57) ABSTRACT

A design methodology reduces electromigration in integrated circuit joints such as flip-chip bumps by seeking to produce a more uniform current distribution at the interface between the integrated circuit pad and the joint while maintaining an interface form that coincides with standard integrated circuit designs is presented. The design methodology addresses the current distribution at the pad by introducing an intermediate trace routing design between the current delivering trace and the pad that distributes the inflow of current from the trace to multiple points of entry on the pad. The intermediate trace routing design includes an outer trace channel connected to the current delivering trace. A plurality of conductive trace leads connect the outer trace channel to the pad. Preferably, each of the plurality of conductive trace leads is characterized by a respective trace impedance so as to distribute equal current flow through each of the leads to the pad.

12 Claims, 6 Drawing Sheets

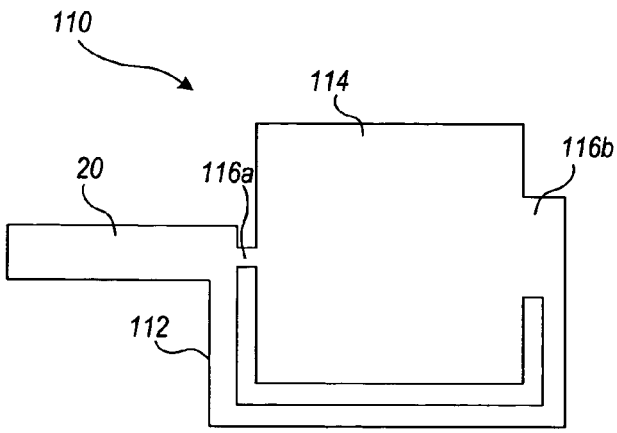
FIG. 6A
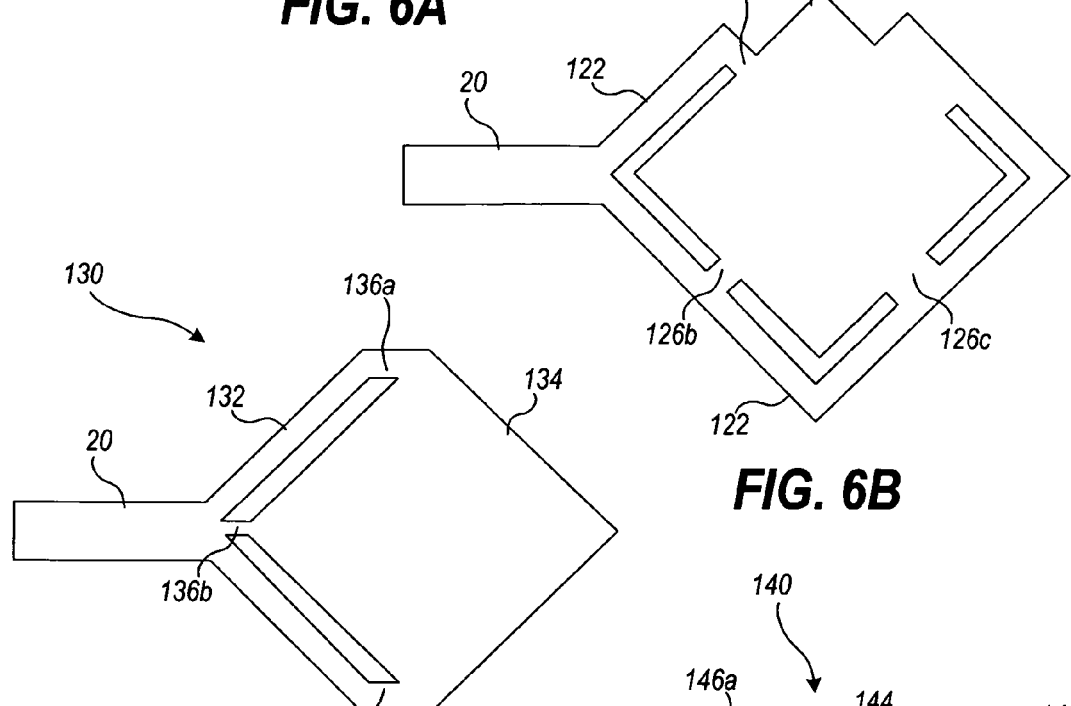
FIG. 6B
FIG. 6C
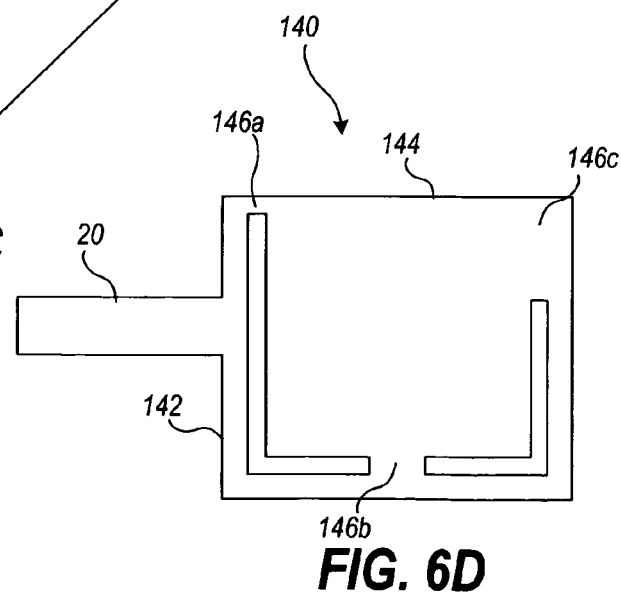
FIG. 6D

TRACE DESIGN TO MINIMIZE ELECTROMIGRATION DAMAGE TO SOLDER BUMPS

BACKGROUND OF THE INVENTION

The present invention relates generally to flip chip packaging technologies for integrated circuits more particularly to a methodology and trace design for minimizing electromigration damage to solder bumps in a ball grid array or flip-chip package.

Electromigration is the movement of material within a conductor that is caused by the flow of electrical current. Electromigration can cause the complete depletion of material within a conductor leading to the loss of continuity. The effect is more apparent at interconnect junctions, for example, in a solder bump connecting a flip-chip die and substrate, and is dependent on the current density (higher being worse than lower), the material (some materials resisting the effects of electromigration more than others), and the geometry of the structure.

Electromigration is a problem commonly seen in high-current-flow bumps of flip-chip assemblies, so named because during formation, the die pads are formed on the top layer of the integrated circuit die, bumps are added, and the die is then "flipped" over and connected directly to the chip substrate via the bumps. More specifically, and with reference to FIGS. 1 and 2, circuit components are formed on a semiconductor wafer using standard fabrication techniques, with local interconnect layers (formed of interleaved metal and dielectric layers) situated closer to the functional circuitry and global interconnect layers formed further up the sequence of layers. Die pads 22 are formed in the uppermost metal layer. Bumps are then added, and the wafer is diced into individual integrated circuit die 14 for packaging. An individual die 14 is then "flipped" over and attached directly to a substrate 12 or board through the bumps 16, as shown in FIG. 1.

Bumps 16 are formed through one of several different processes, including solder bumping, using processes that are well known in the art. FIG. 2 illustrates a portion of a flip-chip assembly 10 which utilizes solder bumps 16. In the solder bumping process, an under bump metallization (UBM) 26 is applied to the chip bond pads, by sputtering, plating, or other means, to replace the insulating passivation layer 24 (typically comprising a polymer such as Benzoclyclobutene or "BCB") typically applied over the top metal layer, and to define and limit the solder-wetted area. Solder is deposited over the UBM 26 by evaporation, electroplating, screen printing solder paste, or needle-depositing.

FIG. 1 illustrates an example of a typical path of current flow 18 in a flip-chip assembly 10 that utilizes a conductive bump 16 for interconnecting the pads (not visible) of an integrated circuit die 14 to pads (not visible) on a chip substrate 12. As shown, a typical current path 18 flows from circuitry (not visible) on the substrate 12, through a bump 16a, through circuitry (not visible) on the die 14, and finally from the die 14 through another bump 16b and into other circuitry (not visible) on the substrate 12. A bump 16 is the element in the current flow path 18 that is often the most susceptible to electromigration damage due to its material, typically a solder, and the fact that the current flow must change directions.

As shown in more detail in FIG. 2, current flowing through the trace 20 and pad 22 within the die 14 must change direction in order to flow through an opening 25, through the conductive pad-to-bump interface (referred to hereinafter as the UBM) 26, through the bump 16 itself, and finally into the substrate pad 28. As indicated with dotted arrows 15 in FIG. 2, this turning causes the current to "crowd" at the upstream side of the bump 16, resulting in a higher current density, J, in the location of crowding. The mean time to fail (MTTF) under electromigration conditions is generally approximated to be $$MTTF \propto \frac{A}{J^n}$$

where A incorporates the effects of temperature and other factors and the power n is in the range of 1 to 2 for lead solders. High local values of the current density, J, may cause failures that are premature in time when compared with the failures that occur when the current is uniformly distributed in the bump 16.

The amelioration of electromigration in bump interconnects is the subject of much study. One prior art solution includes the use of a "bus" structure for high current bumps in order to limit the routable regions within the metal layer(s) used for the bus.

The cross-sectional area of a bump affects the rate of electromigration in the bump. Bump cross-sectional area is partially dictated by the bump-to-bump spacing, with higher spacing typically permitting greater cross-sectional area of the bumps. However, with the competition for smaller and faster packaging, the trend has been towards shrinking the bump-to-bump spacing. Thus, future bumps may have smaller cross-sections, leading to the problem of higher current densities in the bumps.

The choice of material used to implement the bump can also play a significant factor in the electromigration properties of the bump. Presently, bump material is typically made of either a 90% Pb (lead) solder that is known to exhibit some electromigration resistance or a lead-tin eutectic solder that has significantly less resistance to electromigration damage. Future designs may use lead-free materials which have unknown electromigration issues. The ability to remove the electromigration design restrictions as materials change could be an important design asset.

Present designs employ multiple bumps for high current circuits. More electromigration resistant designs may enhance present configurations by carrying these high currents in fewer bumps, thereby reducing chip size and cost or by freeing up bumps for other functions. Future designs could also enjoy these benefits. These advantages may also be shared by lower current signal bumps where, for example, traces may be made narrower which would result in routing enhancements.

In view of the foregoing, it would be desirable to have a technique for redistributing the current flow through integrated circuit component connection joints such as flip-chip bumps in order to reduce electromigration damage caused by current crowding in one area of the joint.

SUMMARY OF THE INVENTION

The present invention is technique for redistributing current flowing to a pad from a trace of an integrated circuit in order to reduce electromigration damage to integrated circuit connection joints connected to the pad, such as flip-chip bumps, caused by current crowding in one area of the joint. The invention is the design and implementation of additional trace routing between a pad of an integrated circuit and the trace delivering current to the pad. The additional trace routing includes an outer trace channel connected to the trace and a plurality of conductive trace leads connecting the outer trace channel to the pad. The original trace is coupled to the pad only through the intervening outer trace channel and conductive trace leads. Thus, all current delivered to the pad flows through the plurality of conductive trace leads. The redistribution of current flow to the pad from a single point of entry (i.e., by a direction connection of the current delivering trace) as in the prior art to multiple points of entry through the plurality of conductive trace leads as implemented according to the invention reduces current crowding in the joint connected to the pad. Preferably, each of the conductive trace leads connecting the outer trace channel to the pad is characterized by a respective impedance that results in a reasonably uniform current density on the pad, which and therefore at the interface to, and through, the connection joint (e.g., flip-chip bump).

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings in which like reference symbols indicate the same or similar components, wherein:

FIGS. 6A through 6D are plan views of alternative embodiments of the invention of pads and associated trace routes that seek to produce a radially uniform inflow of current into the pad and joint attached thereto;

DETAILED DESCRIPTION

Figure 1:
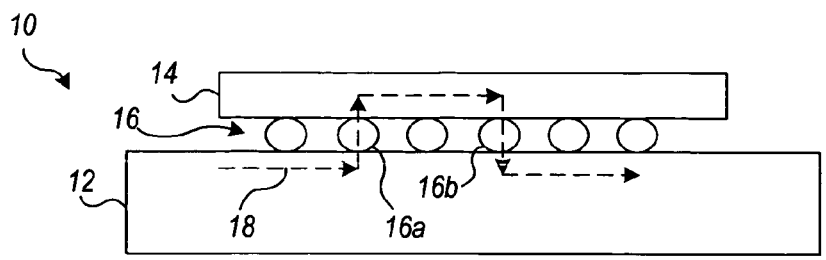
FIG. 1 is a cross-sectional side view of an integrated circuit in a flip-chip package.
Figure 3A:
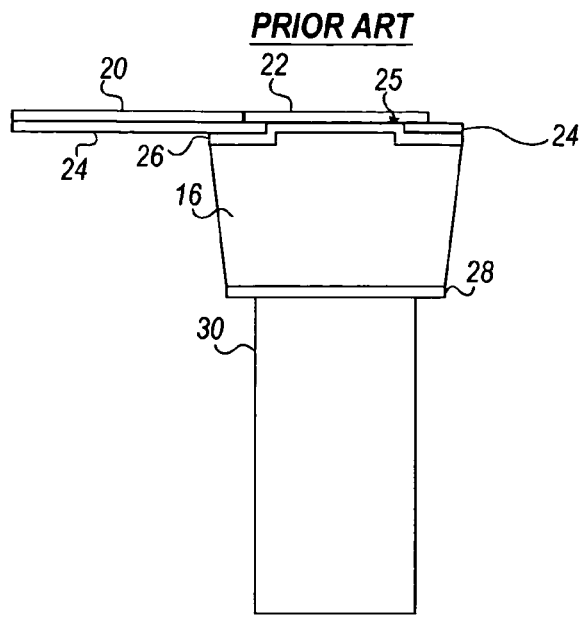
FIG. 3A is a cross-sectional side view of the components included in a single bump junction of the flip-chip assembly of FIG. 1.
Figure 3B:
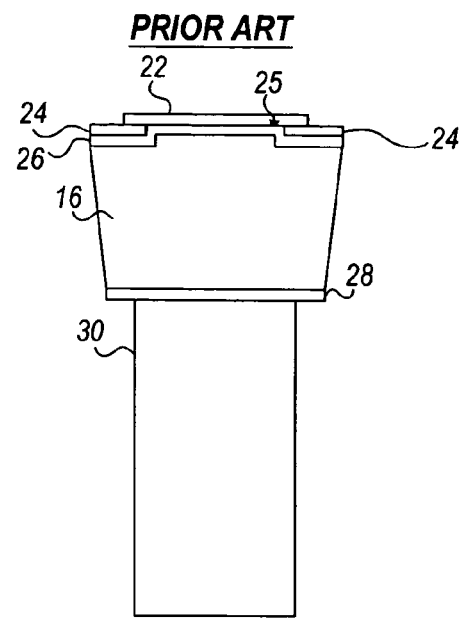
FIG. 3B is a cross-sectional front view of the bump junction of FIG. 3A.
Figure 3C:
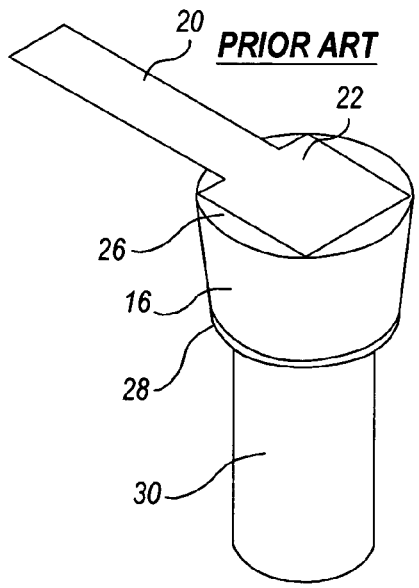
FIG. 3C is an isometric view of the bump junction of FIG. 3A.
Figure 3D:
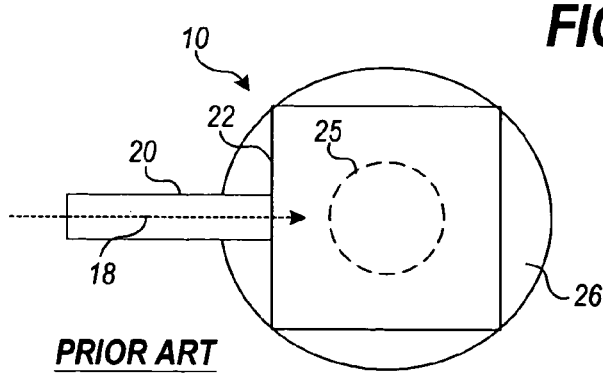
FIG. 3D is a top plan view of the bump junction of FIG. 3A.
Figure 3E:
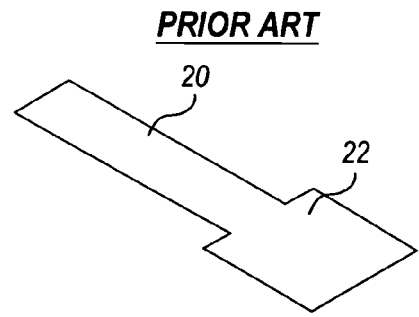
FIG. 3E is a perspective view of the trace and pad of FIGS. 3A-3D.

A novel trace routing design for integrated circuit I/O pads is described in detail below that seeks to introduce current flow delivered by a trace into an integrated circuit pad by routing current flow from the trace delivering the current to the pad through a plurality of traces to the pad or through an intermediate trace channel and multiple conductive leads to the pad. Current is therefore introduced to the pad from a number of different paths rather than the single path that results from a direct connection between the trace and pad. A relatively uniform current distribution may be achieved at the pad opening to the bump (i.e., at the conductive junction between the pad and the UBM), and hence at the bump, through selection of the number, pattern, and relative impedances of the conductive leads connecting the outer channel to the pad, resulting in reduced current crowding and reduced electromigration damage in the joint (e.g., flip-chip bump) connected to the pad. For purposes of comparison, the configuration of a traditional prior art solder bump in a flip-chip assembly is shown in FIGS. 3A, 3B, 3C, 3D, 3E, and 3F. More particularly, FIG. 3A is a cross-sectional side view, FIG. 3B is a cross-sectional front view, FIG. 3C is an isometric view, and FIG. 3D is a top plan view of the components included in a single bump junction of the flip-chip assembly 10 of FIG. 1. FIG. 3E is a perspective view of the trace 20 and pad 22 of FIGS. 3A-3D. As illustrated in FIGS. 3A, 3B, 3C, and 3D, the trace 20 is conductively connected to the pad 22 on the outermost trace layer of the integrated circuit 14 (of FIG. 1). The pad 22 is capped with a passivation layer 24, typically comprising either a nitride or a polymer. An opening 25 is etched into the passivation layer 24 and the UBM 26 is plated over both the opening 25 and a portion of the passivation layer 24. Solder attaches to the UBM 26 during the bumping process to form bump 16, which conductively connects the UBM 26 and the substrate pad 28 when the die is flipped and attached to the substrate 12. The substrate pad 28 is connected to substrate via 30 for routing to circuitry implemented on or otherwise connected to the substrate 12. The metal layers M1, ..., Mn, vias, and UBM are implemented using highly conductive material, typically copper, gold, or other elements or compounds of high conductivity. The dielectric layers D1, ..., Dn-1 and 48 are typically implemented using a polymer such as Benzoclyclobutene (BCB). The bump 16 material is typically copper or a lead solder compound such as PbSn, AuPb, PbAg, etc.

Figure 2:
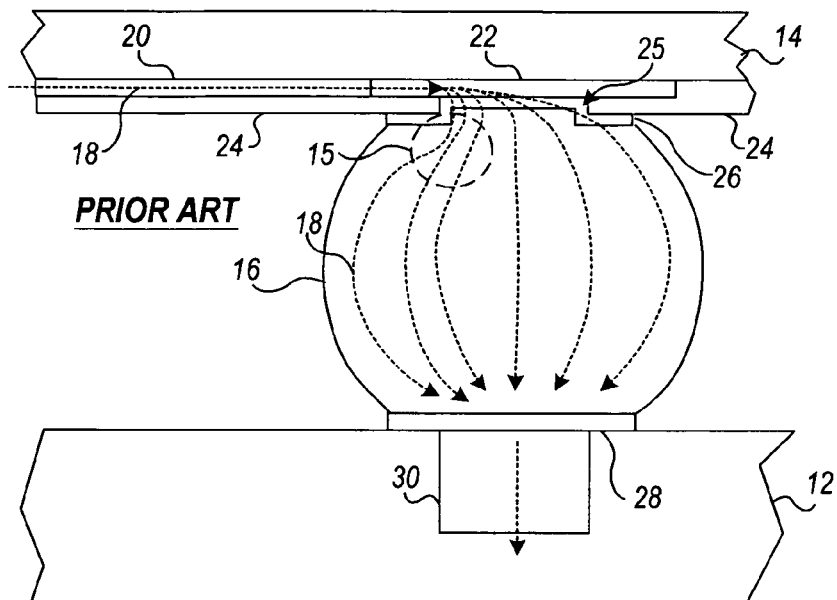
FIG. 2 is a cross-sectional side view of a portion of a flip-chip assembly illustrating a single solder bump.

In the traditional configuration, as shown in FIG. 3D, current enters the pad 22 from the trace 20 along the path 18, and, as illustrated in FIG. 2, causes the greatest current densities in the solder bump 16 in the area indicated at 15 near the opening 25 closest to the trace 22.

Figure 4A:
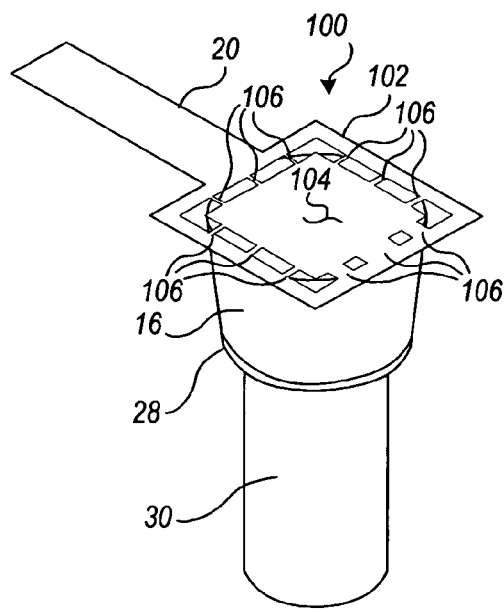
FIG. 4A is an isometric view of the components included in a single bump junction of a flip-chip assembly as implemented in accordance with the invention.
Figure 4B:
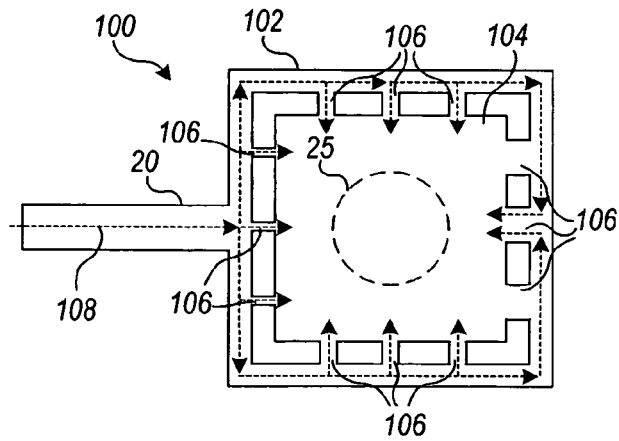
FIG. 4B is a top plan view of the bump junction of FIG. 4B.
Figure 4C:
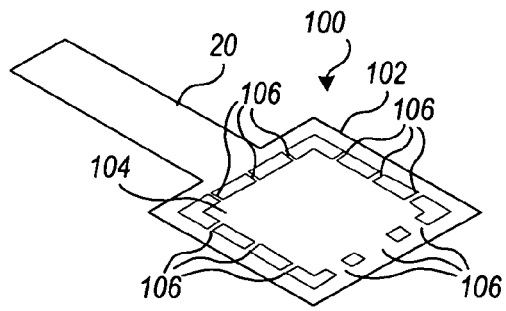
FIG. 4C is a perspective view of the trace and pad of FIGS. 4A-4B.

In a design implemented according to the present invention, as shown in FIGS. 4A, 4B, and 4C, rather than connecting directly to the pad 22, the trace 20 is instead connected to an outer trace channel 102, which is connected to multiple conductive trace leads 106 that connect the outer trace channel 102 and the pad 104. The impedance of the multiple conductive leads 106 may be respectively customized to achieve a relatively uniform current distribution seen on the pad 22. Impedance tailoring of the various conductive leads is reflected in the various widths of the conductive trace leads. A methodology for determining the widths of the leads is described hereinafter.

In the inventive configuration, current delivered by the trace 20 flows into the outer trace channel 102, as indicated by the dotted arrows 108 illustrated in FIG. 4B, and is routed through the outer trace channel 102 to and through the plurality of conductive trace leads 106, and into the pad 104. As described above, the respective resistances of the plurality of conductive conductive trace leads 106 are preferably implemented by design to distribute equal current flow (within a reasonable margin of error) through each lead 106, thereby producing a more uniform current density on the pad 104 and in a bump 16 connected to the pad 104.

Figure 5:
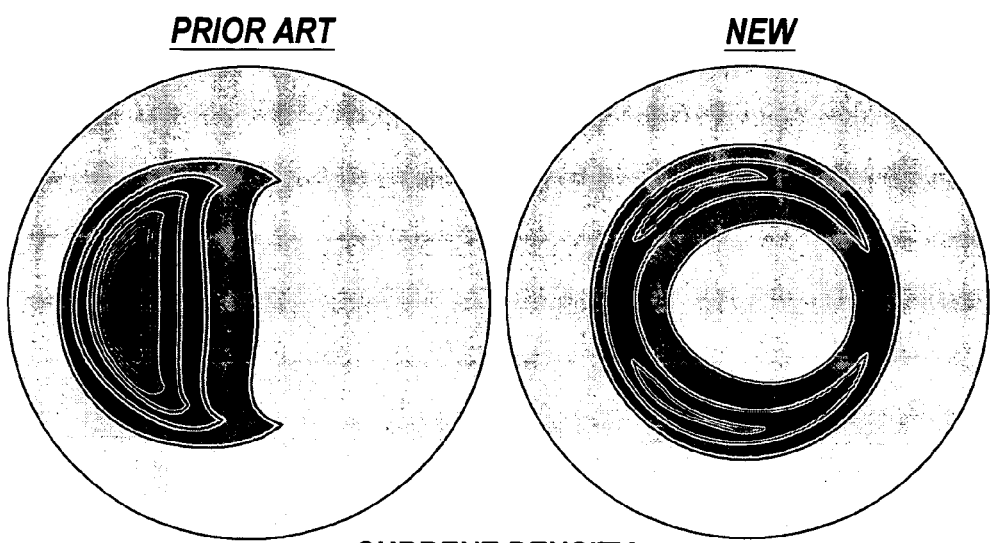
FIG. 5 is a pair of graphs illustrating the current density within a bump at the junction with the UBM of a prior art flip-chip assembly and at the same location when implemented in accordance with the invention.

FIG. 5 presents graphs showing for comparison the current density for a bump 16 coupled to the traditional integrated circuit pad 22 of FIGS. 3A-3E, and the current density for a bump 16 coupled to a pad coupled to a current delivering trace using the trace routing design of the invention of FIGS. 4A-4C. As illustrated, the embodiment of the trace routing design of the invention shown in FIGS. 4A-4C results in a 40% reduction in overall maximum current density. As also illustrated, in the traditional trace-to-pad configuration, current crowding occurs in the area of the bump 16 closest to connection of the trace 20 to the pad 22 and directly below the portion of the UBM within the opening 25. In the configuration of the invention, however, the current is distributed substantially equally around the area near the outer circumference of the opening 25 between the pad 104 and the UBM 26 on the bump 16, resulting in a lower maximum current density across the bump, and therefore eliminating or significantly reducing any current crowding. While the methodology of the invention does not address the intensification of current due to turning effects, a lower value of current density is obtained in the bump 16 due to the use of a plurality of conductive leads 106 to introduce the current to the bump 16 at multiple locations. For the example shown, the invention based design has a current density which is 40% that of the traditional design. For a given current and considering that the exponent, n, may have values between 1 and 2, the invention-based design will have predicted electromigration lives that are 2.5 to 6.25 times greater than that of the traditional configuration.

FIGS. 6A through 6D respectively illustrate alternative illustrative embodiments of trace routing designs implemented according to the principles of the invention. FIG. 6A illustrates a trace routing design 110 that includes an outer channel 112 that routes current around half of the inner pad 114 to introduce current flow through two conductive leads 116a and 116b on opposite sides of the pad. FIG. 6B illustrates a trace routing design 120 that includes an outer channel 122 that routes current five-eighths of the way around the pad 124 in one direction and an eighth of the way around the pad 124 in the other direction, and includes four conductive leads 126a, 126b, 126c, 126d for introducing current to the pad 124. FIG. 6C illustrates a trace routing design 130 that includes an outer channel 132 that routes current a quarter of the distance around the pad 134 in two different directions, and includes three conductive leads 136a, 136b, 136c for introducing current to the pad 134. FIG. 6D illustrates a trace routing design 140 that includes an outer channel 142 that routes current five-eighths of the way around the pad 144 in one direction and an eighth of the way around the pad 144 in the other direction, and includes four conductive leads 146a, 146b, 146c, 146d for introducing current to the pad 144.

As illustrated by these embodiments, the trace routing design is not dependent on the orientation of the inner pad, the junction point of the main current delivering trace connection to the outer channel, the number of conductive leads connecting the outer channel to the inner pad, or the path of the outer channel. Different improvements may be obtained for configurations other than those illustrated. It should be emphasized that symmetry is not a required attribute of the invention, nor is any particular number of conductive leads. Rather, the invention is to introduce the current into the pad from multiple locations such that a reasonably uniform current density is achieved at the bump. In some configurations this will translate to equalizing the current flowing through each of the conductive leads to the pad. In other configurations the currents flow needs to be set up to allow flow in proportions other than equal proportion. Through calculation, the respective impedances of the conductive leads (e.g., through adjusting the widths of the conductive trace leads assuming a constant trace thickness) can be designed and implemented to achieve the desired current density on the pad and therefore at the interface to the bump.

It should also be emphasized that the same invention-based design philosophy may be applied, for example, within the pad/via/trace design in the substrate or in integrated circuit components other than the illustrated flip-chip embodiment.

Figure 7:
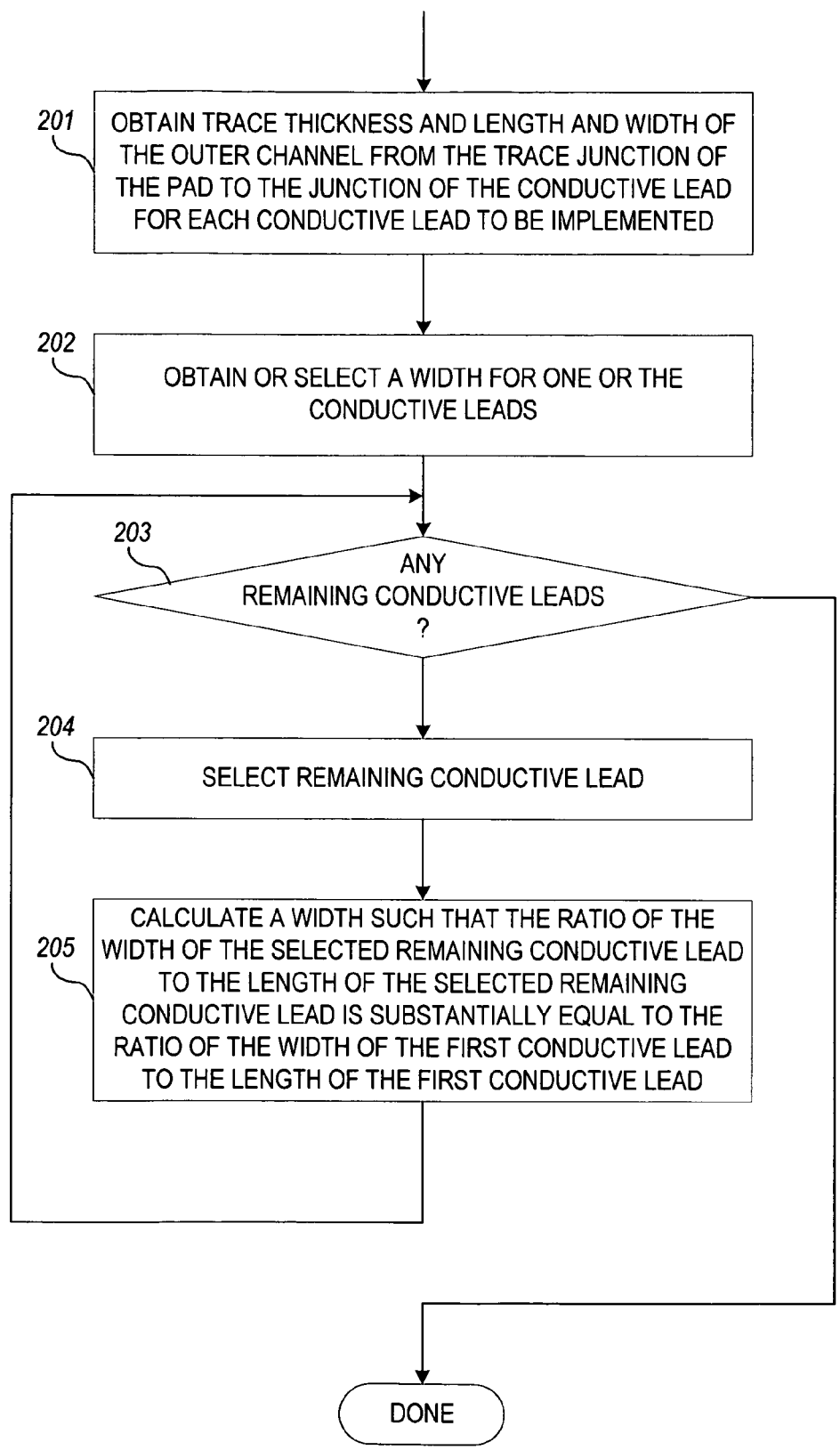
FIG. 7 is an operational flowchart of a method for determining trace widths of conductive leads connecting the outer channel to the inner pad of a pad implemented according to the invention.
Figure 8:
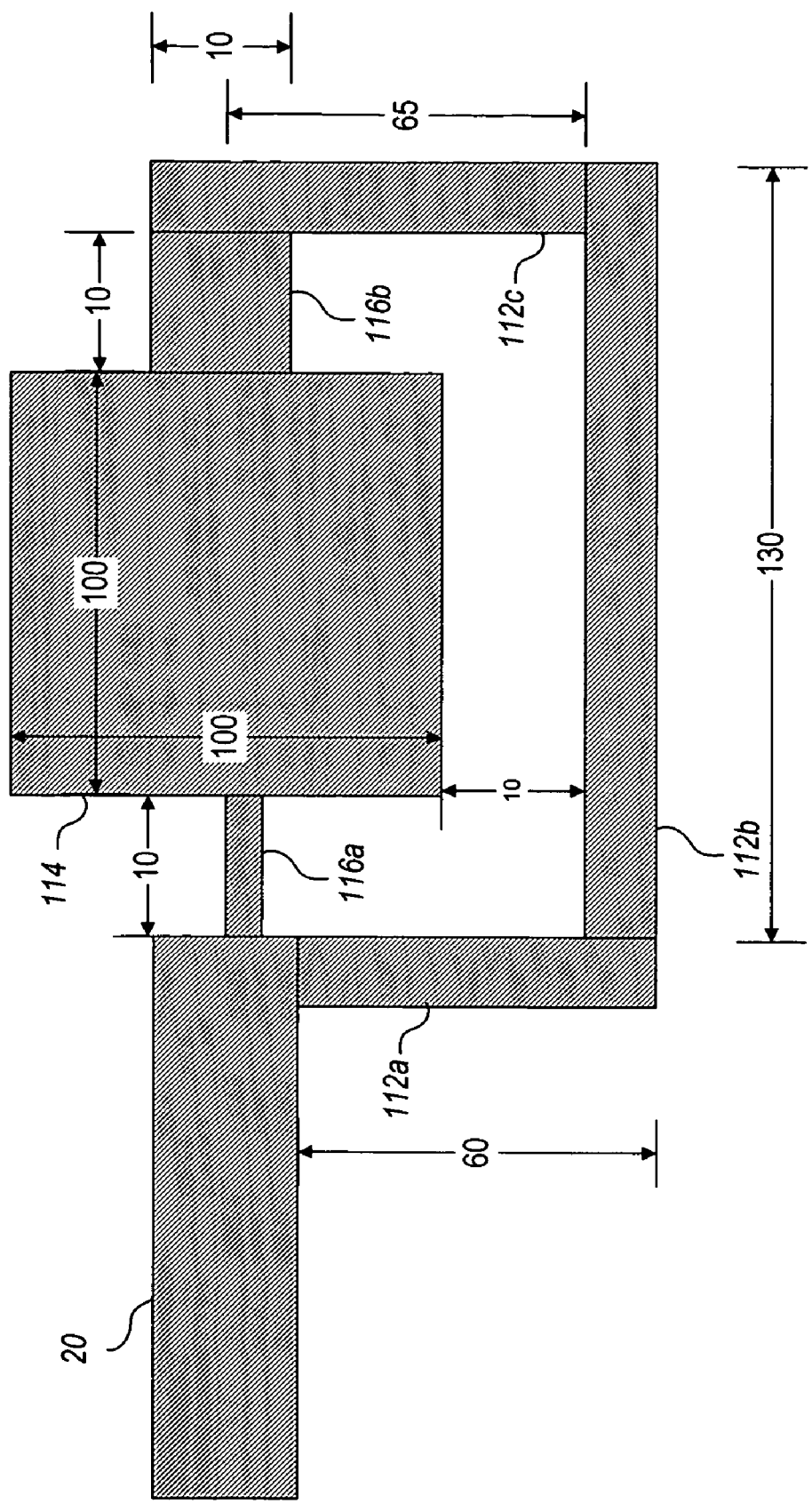
FIG. 8 is a plan view of an example pad of the invention partitioned into trace segments with associated dimensions for use in determining the trace widths of the conductive leads.

FIG. 7 is an operational flowchart illustrating a methodology for determining trace widths of conductive leads connecting the outer channel 102 to the inner pad 104. For simplicity of illustration, the method illustrated is limited to application of non-branching outer channels (e.g., the trace routing design of FIG. 6A) of constant width and thickness. As shown, the method includes the step of obtaining the trace thickness, for each conductive lead to be implemented, obtaining the length and width of the outer channel from the trace junction of the pad 100 to the junction of the conductive lead (step 201). The width of one of the conductive leads is selected or obtained (step 202). For each remaining conductive lead (determined in step 203), one of the remaining conductive leads is selected (step 204), and the width of the selected remaining conductive lead is calculated such that the ratio of the width of the selected remaining conductive lead to the length of the selected remaining conductive lead (obtained in step 201) is substantially equal to the ratio of the known width of the first conductive lead to the known length of the first conductive lead (205). The calculation for branching traces (e.g., the trace routing designs of FIGS. 4A through 4C and 6B through 6D) or those with non-constant geometry follows basic circuit theory where the resistances for each path are tailored such that the current flowing into the pad is the same for all branches. This calculation will be obvious to those skilled in simple resistive circuit theory. For example, consider the two-conductive lead trace design 110 of FIG. 6A. The goal is to construct equal resistance paths from the trace 20 to the pad 114 through the outer channel 112 and each of the conductive leads 116a and 116b. By definition, the resistance R of a conductor is defined as $R=\rho*L/w*t$, where $\rho$ is resistivity, L is trace length, w is the trace width, and t is the trace thickness. FIG. 8 illustrates the two-conductive lead trace design 110 where the outer channel 112 is partitioned into trace segments. Suppose that the width w, thickness t, and resistivity $\rho$ of the channel 112 are all constant. Then, suppose the width of conductive lead 116b is selected to be 10 um. The calculation may thus be stated as: Given $w_{116b}=10$, find $w_{116a}$. So, $w_{116b}/L_{116b}=w_{116a}/L_{116a}$, or $w_{116a}=L_{116a}*(w_{116b}/L_{112a}+L_{112b}+L_{112c}+L_{116b})=10*10/(60+130+65+10)=0.377$ um.

Analysis and comparison of traditional and invention-based trace routing designs in determining the current density distribution within the pad and bump and, in particular, at the interface with the UBM 26 shows that a design implemented according to the principles of the invention has significantly lower current densities at the critical UBM location than those in the traditional design. The maximum current densities are taken to be metrics for the electromigration life of the bumps in each configuration.

While the illustrative embodiments of the invention as presented herein address the metal traces within the die, the invention is also applicable to other electrical designs, for example, the substrate traces, where the combination of current levels, changes in current direction and material sensitivity lead to electromigration problems.

Although this preferred embodiment of the present invention has been disclosed for illustrative purposes, those skilled in the art will appreciate that various modifications, additions and substitutions are possible, without departing from the scope and spirit of the invention as disclosed in the accompanying claims. It is also possible that other benefits or uses of the currently disclosed invention will become apparent over time.

What is claimed is:

1. An integrated circuit, comprising:
   a pad for connection to an integrated circuit joint for receiving an input electrical signal and/or outputting an output electrical signal;
   a trace for delivering current to the pad;
   an outer trace channel connected to the trace; and
   a plurality of conductive trace leads connecting the outer trace channel to the pad.

2. The integrated circuit of claim 1, wherein:
   each of the plurality of conductive trace leads is characterized by a respective impedance such that a current density on the pad resulting from all current flow into the pad is reasonably uniform.

3. The integrated circuit pad of claim 1, wherein:
   each of the plurality of conductive trace leads is characterized by a respective impedance such that current flow through each of the plurality of conductive leads is substantially equal.

4. The integrated circuit pad of claim 1, wherein:
   the outer trace channel, the pad, and the plurality of conductive trace leads are implemented in a single trace layer.

5. The integrated circuit pad of claim 4, wherein:
   the trace layer is characterized by a substantially constant thickness; and
   each of the plurality of conductive trace leads is characterized by a respective impedance such that a current density on the pad resulting from all current flow into the pad is reasonably uniform, and differences in the respective impedance of each of the plurality of conductive trace leads is achieved through differences in trace widths of the respective conductive trace leads.

6. The integrated circuit pad of claim 4, wherein:
   the trace layer is characterized by a substantially constant thickness; and
   each of the plurality of conductive trace leads is characterized by a respective impedance such that current flow through each of the plurality of conductive leads is substantially equal, and differences in the respective impedance of each of the plurality of conductive trace leads is achieved through differences in trace widths of the respective conductive trace leads.

7. A method for implementing an integrated circuit, the integrated circuit comprising a pad for connection to an integrated circuit joint for receiving an input electrical signal and/or outputting an output electrical signal and a trace for delivering current to the pad, the method comprising the steps of:
   connecting an outer trace channel to the trace; and
   connecting a plurality of conductive trace leads between the outer trace channel to the pad.

8. The method of claim 7, further comprising:
   implementing a respective impedance for each of the plurality of respective conductive trace leads such that a current density on the pad resulting from all current flow into the pad is reasonably uniform.

9. The method of claim 7, further comprising:
   implementing a respective impedance for each of the plurality of respective conductive trace leads such that current flow through each of the plurality of conductive leads is substantially equal.

10. The method of claim 7, further comprising:
    implementing the outer trace channel, the pad, and the plurality of conductive trace leads in a single metal layer of the integrated circuit.

11. The method of claim 10, further comprising:
    implementing the single metal layer to have a substantially constant thickness; and
    implementing a respective impedance for each of the plurality of respective conductive trace leads such that a current density on the pad resulting from all current flow into the pad is reasonably uniform, and implementing any differences in the respective impedance of each of the plurality of conductive trace leads through variation in trace widths of the respective conductive trace leads.

12. The integrated circuit pad of claim 10, further comprising:
    implementing the single metal layer to have a substantially constant thickness; and
    implementing a respective impedance for each of the plurality of respective conductive trace leads such that current flow through each of the plurality of conductive leads is substantially equal, and implementing any differences in the respective impedance of each of the plurality of conductive trace leads through variation in trace widths of the respective conductive trace leads.

* * * * *